(12) United States Patent
Dewan et al.

(10) Patent No.: US 11,784,657 B2
(45) Date of Patent: Oct. 10, 2023

(54) DEVICES AND SYSTEMS FOR ANALOG-TO-DIGITAL CONVERSION

(71) Applicant: Infineon Technologies AG, Neubiberg (DE)

(72) Inventors: Ketan Dewan, Unterhaching (DE); Rocco Calabro, Villach (AT); Juergen Schaefer, Oberhaching (DE); David Schaffenrath, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/533,382

(22) Filed: Nov. 23, 2021

(65) Prior Publication Data

US 2022/0166442 A1    May 26, 2022

(30) Foreign Application Priority Data

Nov. 25, 2020 (DE) .......................... 102020131201.6

(51) Int. Cl.
*H03M 1/00* (2006.01)
*H03M 1/38* (2006.01)

(52) U.S. Cl.
CPC .................. *H03M 1/38* (2013.01)

(58) Field of Classification Search
CPC .............................. H03M 1/38; H03M 1/1245
USPC .................................... 341/155, 144, 163
See application file for complete search history.

(56) References Cited

U.S. PATENT DOCUMENTS

| | | | |
|---|---|---|---|
| 2012/0071122 A1* | 3/2012 | Akita | H03M 1/1245 341/172 |
| 2012/0194223 A1 | 8/2012 | Singh | |
| 2016/0329904 A1* | 11/2016 | Duryea | H03M 1/44 |
| 2016/0336953 A1 | 11/2016 | Quiquempoix | |
| 2018/0358977 A1* | 12/2018 | Kato | H04N 25/75 |
| 2022/0200616 A1* | 6/2022 | Camponeschi | H04B 1/0003 |

FOREIGN PATENT DOCUMENTS

DE    102018001052 A1    8/2018

* cited by examiner

*Primary Examiner* — Peguy Jean Pierre
(74) *Attorney, Agent, or Firm* — Eschweiler & Potashnik, LLC

(57) ABSTRACT

An analog-to-digital device includes a sampling circuit for sampling an input signal. The sampling circuit stops sampling in response to obtaining a trigger signal. The analog-to-digital device includes an analog-to-digital converter circuit which includes an analog to digital converter (ADC) for converting a sampled input provided from the sampling circuit to digital output.

19 Claims, 8 Drawing Sheets

DEVICES AND SYSTEMS FOR ANALOG-TO-DIGITAL CONVERSION

REFERENCE TO RELATED APPLICATION

This application claims priority to German Application No. 10 2020 131201.6, filed on Nov. 25, 2020, the contents of which are hereby incorporated by reference in their entirety.

TECHNICAL FIELD

Various embodiments generally relate to systems, devices, and methods for implementing an analog-to-digital conversion.

BACKGROUND

Many applications that rely on analog input measurements implement analog to digital conversion with analog-to-digital converters (ADCs) for controlling control loops. A trigger signal can be used to capture an analog value for conversion. Trigger signals can come from application software or other hardware peripherals, such as peripherals from inside a System-on-a-chip (SoC), or from other electronic or electrical components, such as ASICs or integrated components, to name a few.

For conventional trigger-based conversion, sampling starts when a trigger is received. To enable fast results, the user may configure a small sampling time. A short sampling time results in a charge transfer within a small time, thereby defining input current by the relation/(current)=dq/dt, where q is charge. For example, for a 3 pC charge consumption, in 100 ns sampling time, I=30 uA).

In applications where external blocking capacitors are used, the input charge is taken almost entirely from the external capacitor. To avoid gain errors in this situation, the capacitance of the external capacitor would need to be at least $2^{(x+1)}$ times the capacitance of the sampling capacitor, where x is the resolution of the ADC. In one example, e.g., a 12-bit resolution with an input sampling capacitor of 1 pF, an external capacitor would need to be at least 8192 pF or approximately 8.1 nF, which leads to higher costs.

Further, as trends go to faster and higher performance SoC's, it is required to go to smaller technology nodes. At smaller technology nodes (e.g., 28 nm), capacitors tend to exhibit a memory effect affecting the performance of an ADC utilizing sample and hold (S/H) circuits.

Conventional approaches in analog to digital conversion result in costlier components, more power, more PCB space, and higher PCB and system complexity design. Further, dielectric absorption effects can be observed that result in performance degradation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
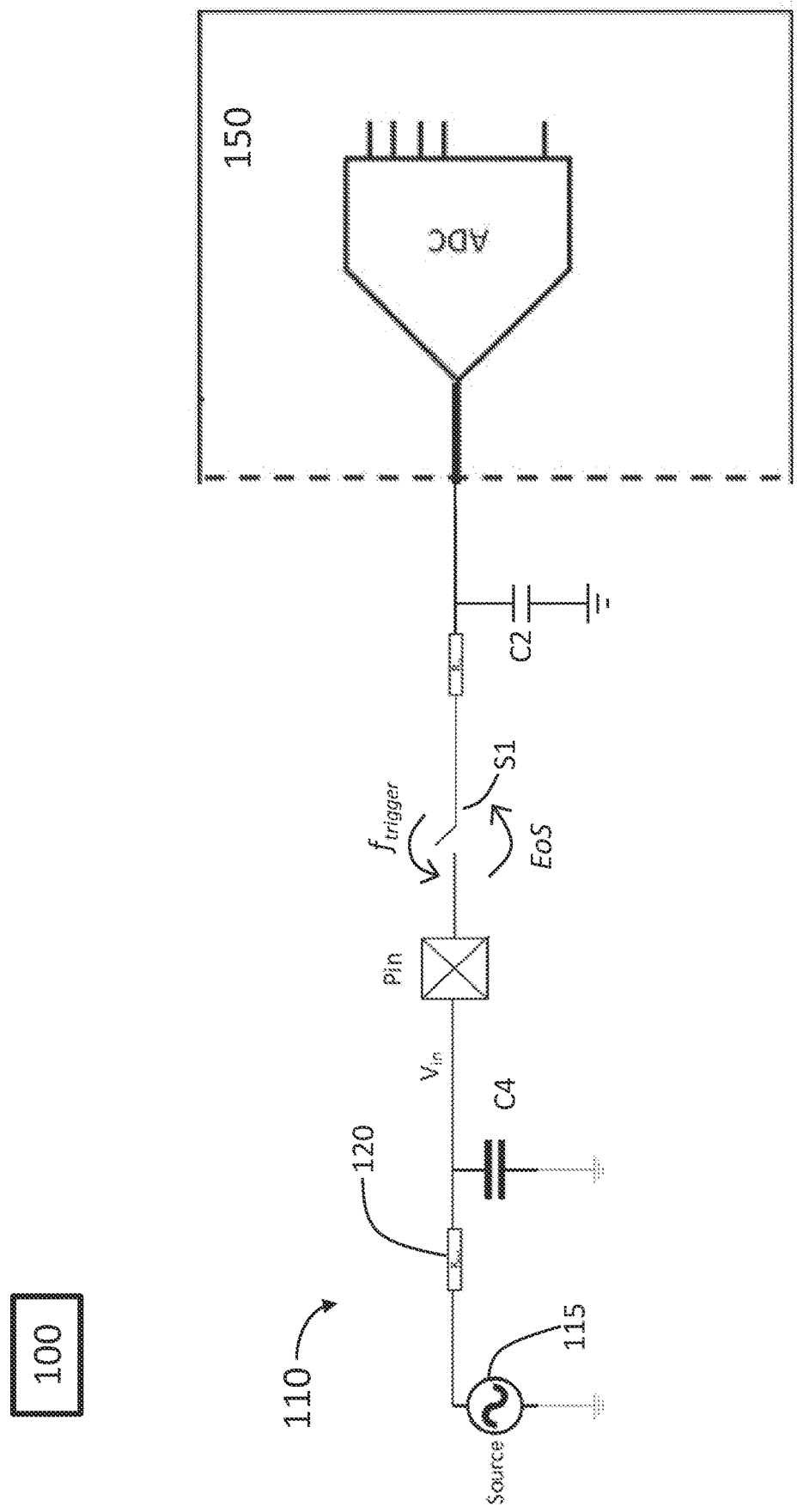
FIG. 1 illustrates an example analog-to-digital device.

The following detailed description refers to the accompanying drawings that show, by way of illustration, specific details and embodiments in which the invention may be practiced.

Throughout the drawings, it should be noted that like reference numbers and symbols are used to depict the same or similar elements, features, and structures.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more. The terms "proper subset", "reduced subset", and "lesser subset" refer to a subset of a set that is not equal to the set, i.e. a subset of a set that contains fewer elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term data, however, is not limited to the aforementioned examples and may take various forms and represent any information as understood in the art.

The term "processor" or "controller" as, for example, used herein may be understood as any kind of entity that allows handling data, signals, etc. The data, signals, etc. may be handled according to one or more specific functions executed by the processor or controller.

A processor or a controller may thus be or include an analog circuit, digital circuit, mixed-signal circuit, logic circuit, processor, microprocessor, Central Processing Unit (CPU), Neuromorphic Computer Unit (NCU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "system" (e.g., a drive system, a position detection system, etc.) detailed herein may be understood as a set of interacting elements, the elements may be, by way of example and not of limitation, one or more mechanical components, one or more electrical or electronic components, one or more instructions (e.g., encoded in storage media), one or more controllers, etc.

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, signal processor, Central Processing Unit ("CPU"), Graphics Processing Unit ("GPU"), Neuromorphic Computer Unit (NCU), Digital Signal Processor ("DSP"), Field Programmable Gate Array ("FPGA"), integrated circuit, Application Specific Integrated Circuit ("ASIC"), etc., or any combination thereof. Any other kind of implementation of the respective functions which will be described below in further detail may also be understood as a "circuit." It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

As used herein, "memory" may be understood as a non-transitory computer-readable medium in which data or information can be stored for retrieval. References to "memory" included herein may thus be understood as referring to volatile or non-volatile memory, including random access memory ("RAM"), read-only memory ("ROM"), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component including one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip. In contexts involving dielectric absorption, "memory" or "memory effect" may refer to an effect caused dielectric absorption or relaxation in which a capacitor experiences or realizes a previous or past voltage.

FIG. 1 shows an example analog-to-device 100 that utilizes a trigger approach. The analog-to-digital converter device 100 includes a sampling circuit 110 and an analog-to-digital converter (ADC) circuit 150. The sampling circuit 110 can sample an analog signal and provide a sampled input to the ADC circuit 150. The sampling circuit 110 includes or can include an input capacitor C4 coupled between an input source 115 and a reference potential. The input source 115 and the input capacitor C4 are coupled to a switch S1. The circuit shows an exemplary resistance 120 between the input source and the switch S1.

This switch S1 controls the sampling performed by the sampling circuit 110. Sampling occurs when the switch S1 is closed, and sampling ceases, stops, or pauses when the switch S1 is open. In FIG. 1, a sampling capacitor C2 is located between the switch S1 and the ADC circuit 150. As shown, the sampling capacitor C2 is coupled to a reference potential (e.g., ground) and can hold the value of sampled input, e.g., a sampled voltage.

The switch S1 can be any suitable switch, e.g., an electronic switch configured to selectively close to sample input in response to an obtained trigger or trigger signal. When the switch S1 gets or receives a trigger signal, the switch S1 closes to initiate sampling. The sampling circuit 110 may be configured so that when a trigger signal is received, the sampling circuit 110 samples for a period of time, $t_{sample}$. After this period, the switch S1 (re-)opens. The analog-to-digital conversion can start when the switch S1 opens.

The ADC circuit 150 can convert the input, e.g., sampled input to a digital output or digital signal. In the example of FIG. 1, the ADC circuit 150 is a successive-approximation register (SAR) type of ADC. ADC circuits, such as the ADC circuit 150 can include a holding circuit holding a value or input. In one example, the ADC circuit 150 can include one or more switches, a comparator, a capacitive DAC (Digital-to-analog converter) and a connection to a reference trough.

The ADC circuit 150 can begin converting or holding as it receives sampled input from the sampling circuit 110. In other words, the conversion process may start after the trigger signal is sent or received.

Figure 2:
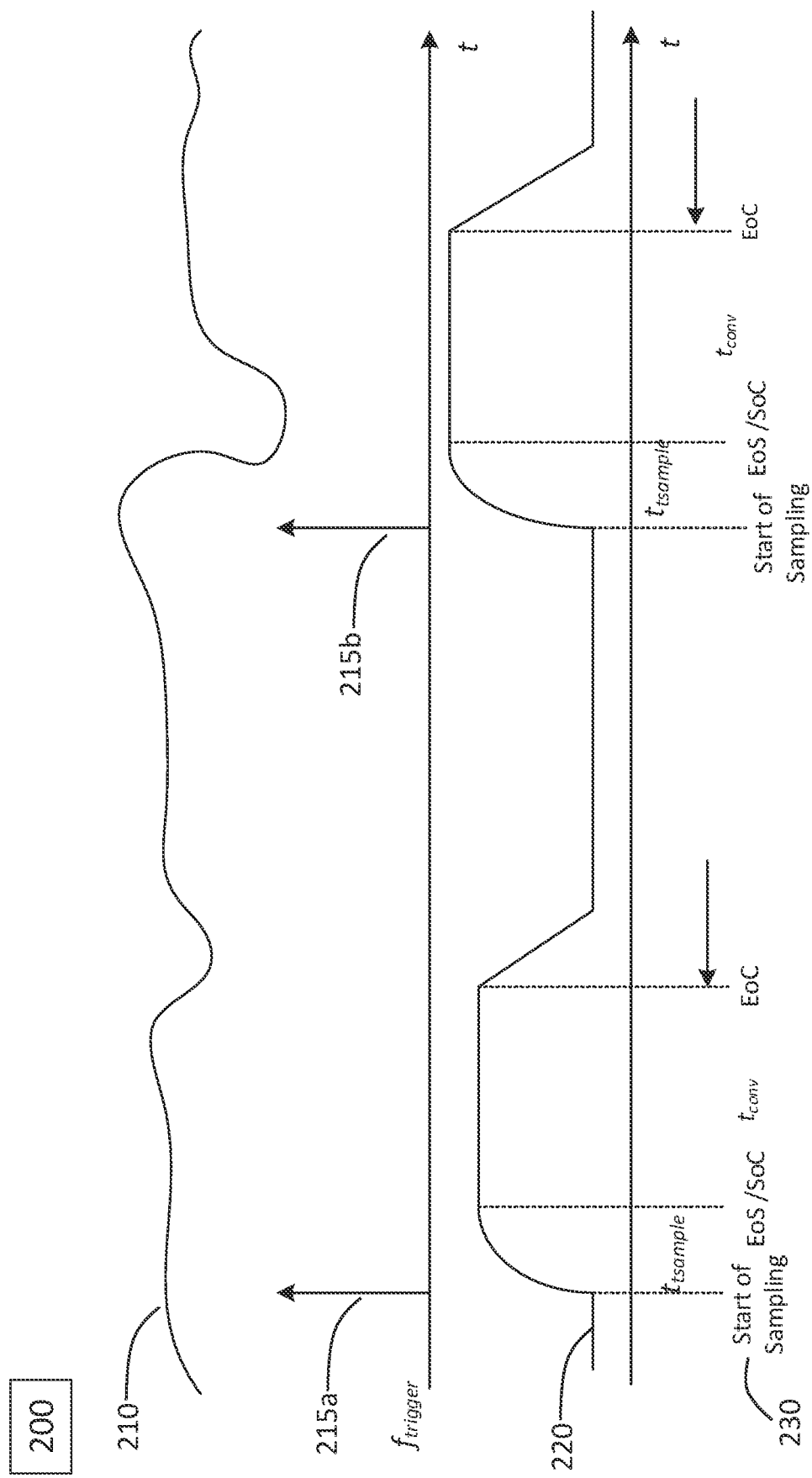
FIG. 2 illustrates an input signal, trigger signals, and sampling circuit response for the example analog-to-digital device of FIG. 1.

FIG. 2 shows a graph showing an exemplary input signal 210 versus time (t) that may be input to the ADC device 100. The graph 200 shows exemplary trigger signals 215 that are received, $f_{trigger}$ and the response 220 of the sampling capacitor. The graph also indicates the timing of certain events. For example, at 230, the sampling circuit 110 closes in response to a received trigger signal 215a, which initiates sampling (Start of Sampling). As shown, the sampling circuit 110 samples for the sampling period, $t_{sample}$. At the end of the sampling period ("End of Sampling" or "EoS"), the digital conversion of the sampled input begins, which is called the "Start of Conversion" or "SoC". The conversion period $t_{conv}$, corresponds to the time in which the sampled input is converted or is put on hold and then converted by the ADC circuit 150. The end of the conversion period is labeled as "End of Conversion" or "EoC". Sampling does not begin again until another trigger signal, 215b is received.

Therefore, for the ADC device 100, the overall trigger time period ($t_{trigger}$) is a function of the sampling time ($t_{sample}$) and the conversion time ($t_{conv}$). Further, the conversion time, $t_{conv}$ is a function of the desired resolution and the operation frequency of the ADC circuit 150. The sampling time, t a function of the sampling capacitor, $t_{sample}$ is C2, voltage change, and input current ($I_{in}$). The sample time, $t_{sample}$ can be approximated using the following equation, which ignores or fails to take into account a minimum settling time which depends on the ADC's resolution:

$$t_{sample} = C2 * (dV/I_{in})$$

The equation assumes a constant input current, and thus an average input current is used for $I_{in}$ in the equation. The change in voltage, dV may be constant for certain applications, such as, for example, power trains (e.g., dV is 5V), RADAR applications (e.g., dV is 3.3V).

The sampling capacitor C2 may also be chosen or given by the particular technological application as certain requirements, such as gain error, Total Adjustment Error (TAE), offset error, etc. The value of C2 may be assumed to be constant. TAE can be measured in terms of deviation from an ideal conversion result, such as, for example, as the accumulation of gain, offset, and linearity type errors, and/or errors related to crosstalk, relaxation, and/or noise.

Figure 3:
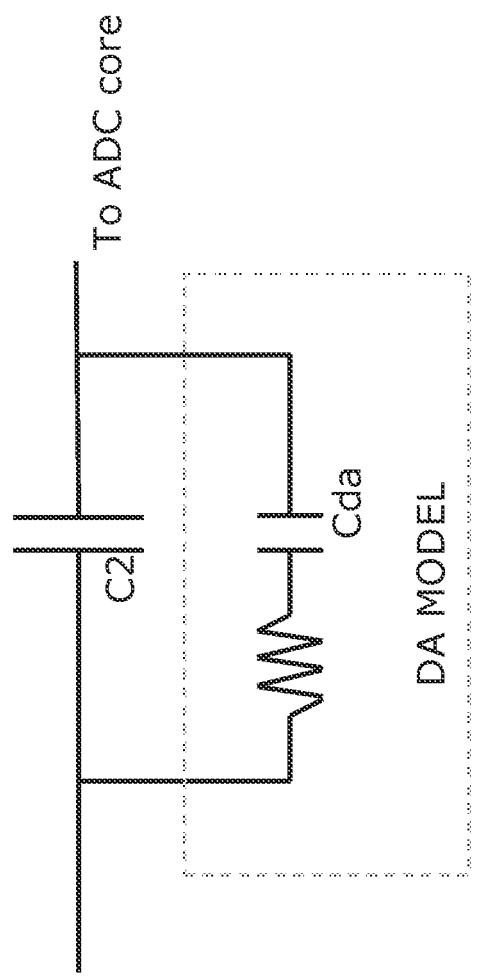
FIG. 3 illustrates a circuit model for an example sampling capacitor including a simplified dielectric absorption model.

FIG. 3 shows a model for a sampling capacitor accounting for dielectric absorption (DA) effects. The DA model includes the sampling capacitor being in parallel with a capacitor $C_{da}$ and a resistor. During an idle phase, where there is no sampling of input, the capacitor C2, and the capacitor $C_{da}$ can be charged. However, if the subsequent sampling time is not enough, the input voltage being sampled will not fully or wholly overwrite or erase residual delta voltage on $C_{da}$. As such, the voltage sampled by the capacitor C2 will be corrupted during the hold and conversion phase, resulting in incorrect conversion value. This memory effect from the capacitor $C_{da}$ worsens with a reduction in sampling time and a reduction in the difference between an input voltage and a reference voltage of the sampling circuit. Furthermore, lengthening the holding time by the sampling circuit can also lead to more charge from the $C_{da}$ being redistributed to the C2 capacitor, and thus corrupting its sampled value.

Figure 4:
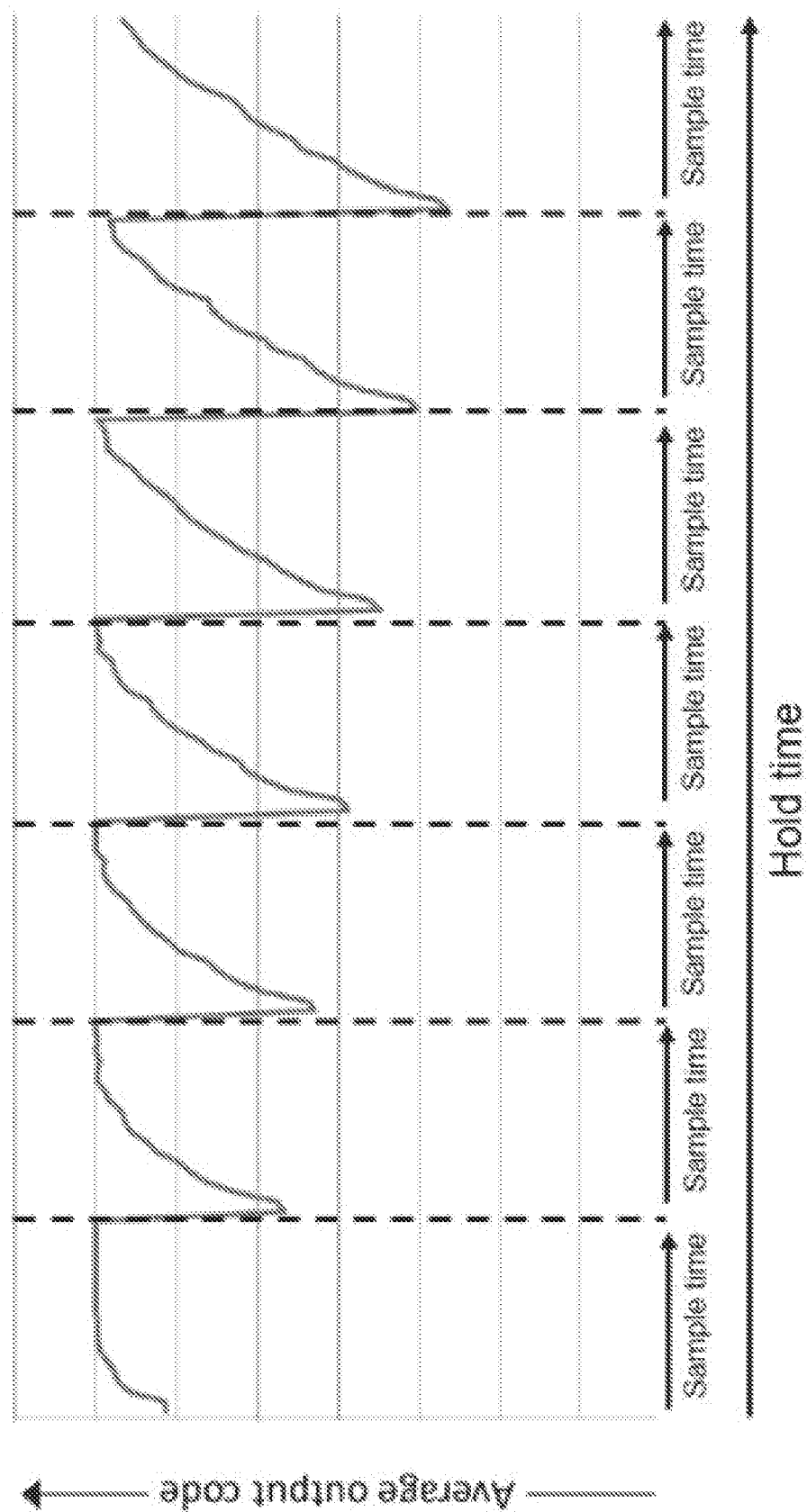
FIG. 4 shows results of conversion of a constant input voltage over various combinations of sampling and hold time for an example sample and conversion process.

FIG. 4 shows results of exemplary conversion of constant input voltage over various combinations of sampling and hold time for a convention sample and conversion process. No values are provided for either axis as the graph is merely intended to convey the nature of the conversion output over a prolonged sampling and hold time.

In general, to achieve higher conversion throughput and/or reduced conversion latency, the sample time $t_{sample}$ needs to be as small as possible. However, to reduce dielectric absorption effects, hold and conversion time needs to be small while the sample time is high. Solutions that involve using a higher input current to alleviate some of the above-noted problems require costlier sensors and higher system design costs. Further, the use of bigger blocking capacitors to alleviate the above-noted deficiencies is also problematic. For example, referring to the device 100 of FIG. 1, the capacitor C2 takes charge from blocking capacitor C4, causing a drop of voltage in capacitor C4 and leading to gain error. An increase or bigger capacitance for the C4 capacitor leads to cost increases from system design and printed circuit board (PCB) costs.

Figure 5:
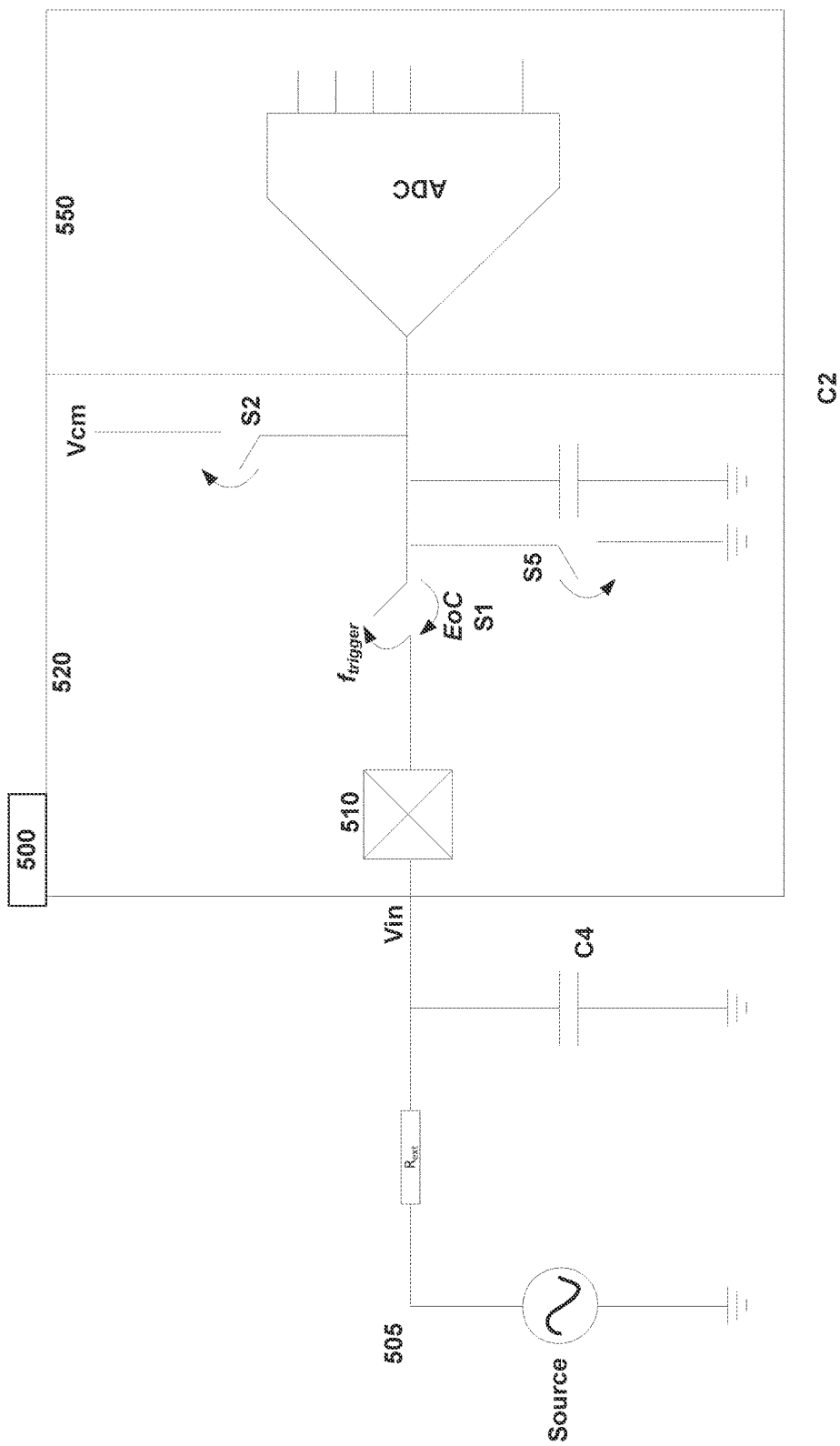
FIG. 5 shows an example analog-to-digital device according to at least one embodiment of the present disclosure.

FIG. 5 shows an analog-to-digital converter device 500 according to at least one exemplary embodiment of the present disclosure. The ADC device 500 includes a sampling circuit 520 and an analog-to-digital converter (ADC) circuit 550. The ADC device 500 can be trigger-based. In at least one example, the device 500 can be configured to sample an analog signal and then convert sampled input to a digital output in response to a trigger signal.

The sampling circuit 520 couples to an input source 505 with $R_{ext}$ representing input resistance. The input source 505 can provide an analog signal as input that is to be sampled by the sampling circuit 520.

The sampling circuit 520 includes an input capacitor C4 coupled to an input 510 of the sampling circuit 520. The sampling circuit 520 can be configured to sample or perform sampling until the sampling circuit is triggered. The sampling circuit 520 can sample a signal provided from the input source 505 and then stop or pause the sampling in response to a received or obtained trigger signal. The stop or pause in sampling by the sampling circuit 520 may occur immediately after the trigger signal is sent or received. In other cases, the sampling can stop or pause after a predefined or configurable period of time. The trigger signal may be generated from one or more components of the ADC device 500 or generated and sent from a component or circuitry external to the ADC device 500.

As shown in the example of FIG. 5, the sampling circuit 520 includes a sampling switch S1 and a sampling capacitor C2. The sampling switch S1 can be coupled between the input 510 and the sampling capacitor C2. The sampling switch S1 can control the sampling operation performed by the sampling circuit 520. The sampling switch S1 can be configured to control when sampling is to occur. When the sampling switch S1 is closed or in a closed state, the sampling capacitor C2 is electrically coupled to the input source of the sampling circuit 520 and thus can obtain a sample value from an input signal. The continuous closure of the sample switch S1 allows or enables continuous sampling of an input signal.

The sampling circuit 520 stops sampling in response to the sampling switch S1 being opened or in an open state. As mentioned, the sampling circuit 520 stops sampling when the sampling switch S1 opens. This opening of the switch S1 to stop the sampling occurs immediately after the trigger, or after a configured or predefined period of time after the trigger. In response to the triggering, the sampling circuit 520 can be configured as a hold circuit that holds the current sampled value or voltage at the sampling capacitor C2, and the ADC circuit 550 can obtain the held value. That is, the sampling circuit 520 can also be configured as a hold circuit. In one or more examples, a hold time, or the time that the sample circuit 520 needs to hold the sampled value, may be defined as from the end of sampling (EoS) until the start of conversion (SoC), when the sampled value is obtained from the sampling circuit 520.

In various embodiments, the sample switch S1 can be configured to be opened by a trigger or trigger signal ($f_{trigger}$) which causes sampling to cease by breaking, interrupting, or opening an electrical connection between the input source 505 and the sampling capacitor C2.

In embodiments, the sampling switch S1 may be closed by default. For example, upon powering up the ADC device 500 or the sampling circuit 520, the sampling switch S1 may be closed to enable or allow sampling. In other words, the sampling switch S1 may be considered a normally closed switch that only transitions to an open state in response to a received or obtained trigger signal.

In response to a trigger signal, the sampling switch S1 can open for a period of time. For example, the switch S1 can be configured to remain open at least as long as the ADC circuit 550 performs a conversion process. The switch S1 may also be configured to close at or after the end of a conversion process by the ADC circuit. The period of time the switch S1 is in the open state may be predefined or predetermined, or in other cases, maybe indeterminate beforehand. In at least one example, the switch S1 may be configured close in response to another trigger, e.g., a trigger sent to the sampling circuit 520. This second trigger can correspond to the end of conversion (EoC) by the ADC circuit 550. Such a signal may be generated by the ADC circuit 550 or an external component not shown.

The sampling circuit 520 may further include switches S2 and S5, each coupled between a potential and the sampling capacitor C2. For example, as shown in FIG. 5, the switch S5 may be coupled between an input side of the sampling capacitor C2 and a reference potential (e.g., ground). The switch S2 may be coupled between an output side of the sampling capacitor C2 and a voltage potential ($V_{cm}$). These switches can be configured to transition between open and closed states such as, for example, in response to the trigger signal that causes the sampling switch S1 to open. The S2 switch may be closed during sampling and opened during a digital conversion process performed by the ADC circuit 550. The switch S5 may be opened during sampling and closed during the conversion process by the ADC circuit 550. That is, the switches S2 and S5 may be configured to facilitate holding of sampled input.

The ADC circuit 550 of FIG. 5 is configured to perform a conversion operation on sampled input obtained from the sampling circuit 520. The ADC circuit 550 may be configured to hold received sampled input and configured to convert obtained sampled input to a digital output. The ADC circuit 550 may include any suitable type of ADC circuit to accomplish or perform such functions. In the example of FIG. 5, the ADC circuit can be a successive approximation register (SAR) ADC 550 circuit. For example, the ADC circuit 550 can include a comparator, and can further include one or more switches coupled between the comparator and voltage or reference potentials. The ADC circuit 550 also can include internal digital logic (e.g., digital logic or hardware components) for receiving a signal that is output from the comparator in order to implement known successive approximation register functions for providing a digitized output.

The stop of a sampling period (EoS or End of Sampling) by the ADC device 500 can occur in response to a triggering, e.g., an obtained or received trigger signal that ends sampling by the sampling circuit 520. The sampling capacitor C2 holds the sampled voltage or sampled value during a hold time period corresponding from the triggering to the start of conversion (SoC).

Further, this triggering can initiate or start the conversion process by the ADC circuit 550. Specifically, at or after the end of sampling (EoS), (e.g., when the sampling switch S1 is open) the ADC circuit 550 obtains the sampled input from the sampling circuit 520 (e.g., from the sampling capacitor C2) and then can hold and/or convert the sampled input. The ADC circuit 550 may be configured to control one or more switches, e.g., close a switch, in response to a trigger signal for obtaining a sampled input from the sampling circuit 520. For example, a switch of the ADC circuit 550 can be closed to get a current sampled input from the sampling circuit, e.g., obtain the current input value or sampled voltage from the sampling capacitor C2 of the sampling circuit 520. In other words, such a switch can be configured to close in response to a trigger signal, such as the same trigger signal that causes the sampling switch S1 to open. In other cases, or another generated trigger signal that corresponds to the end of sampling or start of conversion can cause the switch to close.

During conversion by the ADC circuit 550, the ADC circuit 550 holds and/or converts the obtained sampled input to a digital output. The ADC circuit 550 may be implemented or configured as a holding circuit for holding the sampled input. This held sampled input may be held for later digital conversion. In other cases, the ADC circuit 550 may immediately convert the obtained sampled input to digital output, e.g., without an intermediate holding time. As such, the conversion process can include holding the sampled input and/or converting the sampled input to a digital output.

In embodiments, after or at the end of the conversion (EoC), the sampling switch S1 is configured to close and sample again, until another trigger occurs (e.g., a trigger that causes the sample switch S1 to open and stop sampling). The trigger signal can be sent to selectively cause the conversion of sampled input at a particular time.

The ADC device 500, when not converting, is always or continuously sampling. For example, the ADC device 500 can be configured to continuously sample input up to a triggering. The average input current can be approximated as $I_{in}=C2*(dV/dt_{trigger})$, when the hold and conversion time is negligible compared to sample time (e.g., $dt_{trigger} \sim dt_{sample}$).

Further, as a result of this continual sampling before the triggering event, the input current for the device can be reduced approximately by the ratio of:

$$t_{trigger}/t_{sample}$$

where $t_{sample}$ refers to the sample time of a convention device or a minimum sample time, and where $t_{trigger}$ refers to sample time of the ADC device 500.

For example, a trigger period may be 10 µs, and a minimum sampling time may be 100 ns. Therefore, the input current $I_{in}$ can be reduced by a factor of 100 (10 µs/100 ns). The reduced current can eliminate or significantly reduce the need for or value of the external capacitor C4.

Figure 6:
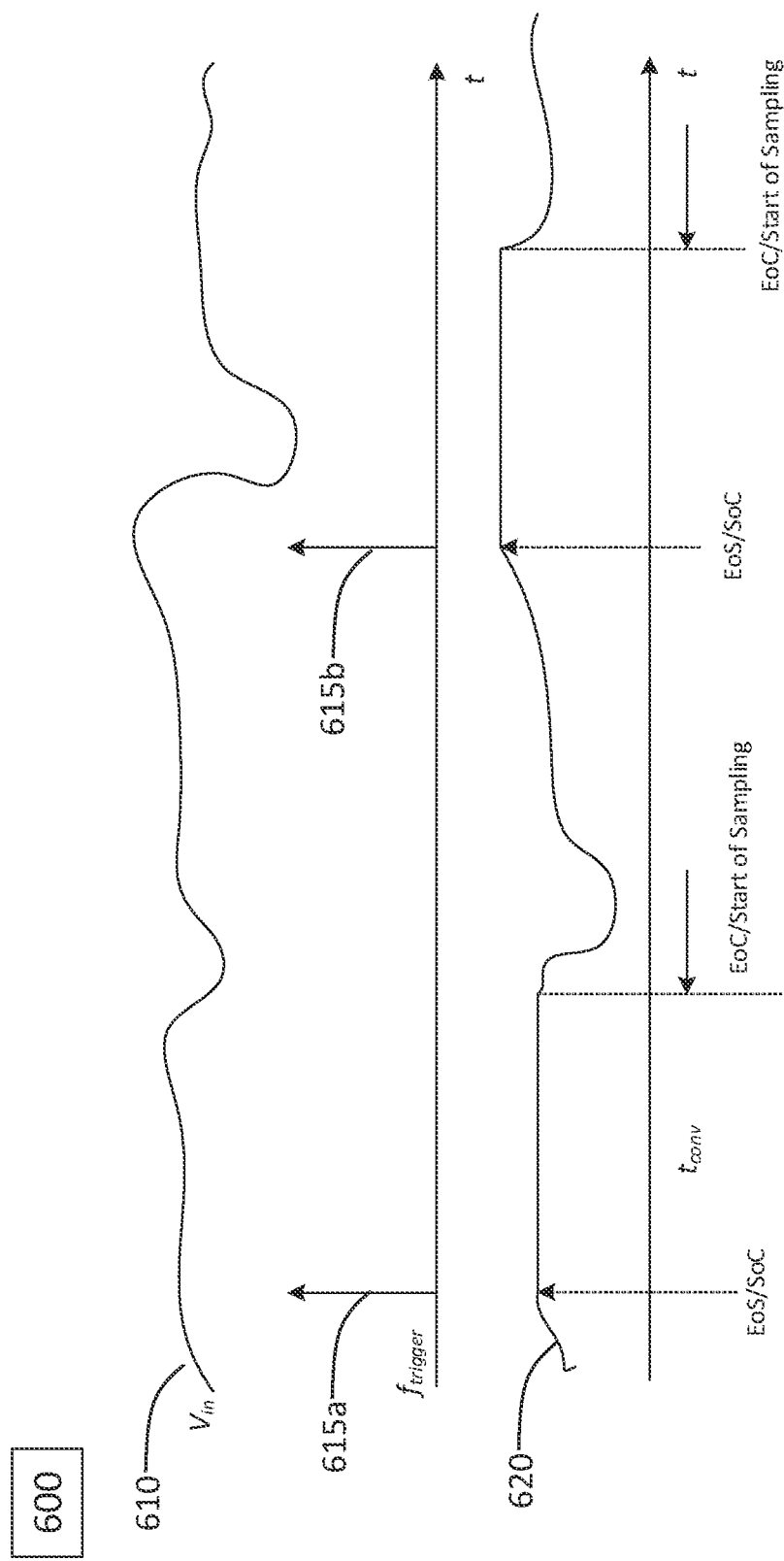
FIG. 6 is a graph showing an input signal, trigger signals, and sampling circuit response versus time for the example analog-to digital converter device of FIG. 5.

FIG. 6 shows a graph 600 showing an exemplary input signal 610 versus time (t) that may be input to a device such as the ADC device 500 of FIG. 5. The graph 200 also includes exemplary trigger signals $f_{trigger}$ 615. The lower half of the graph 600 shows an exemplary response 620 of the sampling circuit or sampling capacitor of the ADC device 500. As an input signal is inputting to the device, the sampling capacitor charges with a sampling voltage from the input signal. Then in response to a trigger ($f_{trigger}$), the sample switch opens, and the device transitions to conversion phase (EoS/SoC), wherein the ADC circuit 550 starts holding and/or converting the current sampled input (e.g., current sampled voltage) held by the sampling circuit 520. As mentioned, the EoS may occur immediately after the trigger is obtained, or after a predefined or configurable period of time. Although not shown, a hold time can exist between the EoS and SoC during which the sampling circuit 520 holds the sampled value for the ADC circuit 550.

During the conversion time period ($t_{conv}$), the sampling voltage is constant. Then at the end of conversion and (re)start of sampling (EoC/SoS), the sampling capacitor will again charge according to the input signal until a trigger signal initiates the conversion process again.

During the period of time corresponding to the start of sampling up until the sampling circuit is triggered (e.g., obtains the trigger signal), the sampling circuit is continuously sampling. The sampled value or voltage of the sampling capacitor captured at the trigger time may be provided to the ADC circuit 550 for conversion. The continuous sampling, occurring up until the trigger, prevents the sampling voltage, e.g., the voltage at the sampling capacitor, from reaching or resetting to a fixed or configurable reference potential. Said differently, the sampling circuit 520 samples input immediately without reset to mitigate or reduce the memory effect at the sampling capacitor due to dielectric absorption. In other words, referring back to FIG. 3, the continuous sampling period allows the voltage at the $C_{da}$ capacitor of the dielectric absorption model to closely follow the sampling voltage. Therefore, there is less corruption of the sampling voltage at the capacitor C2 when the sampling circuit 520 is triggered, which results resulting in a reduction in errors for the output of the ADC circuit 550. This approach allows for increasing or stretching the sample time, e.g., to a maximum and allow for weaker input sources.

Figure 7:
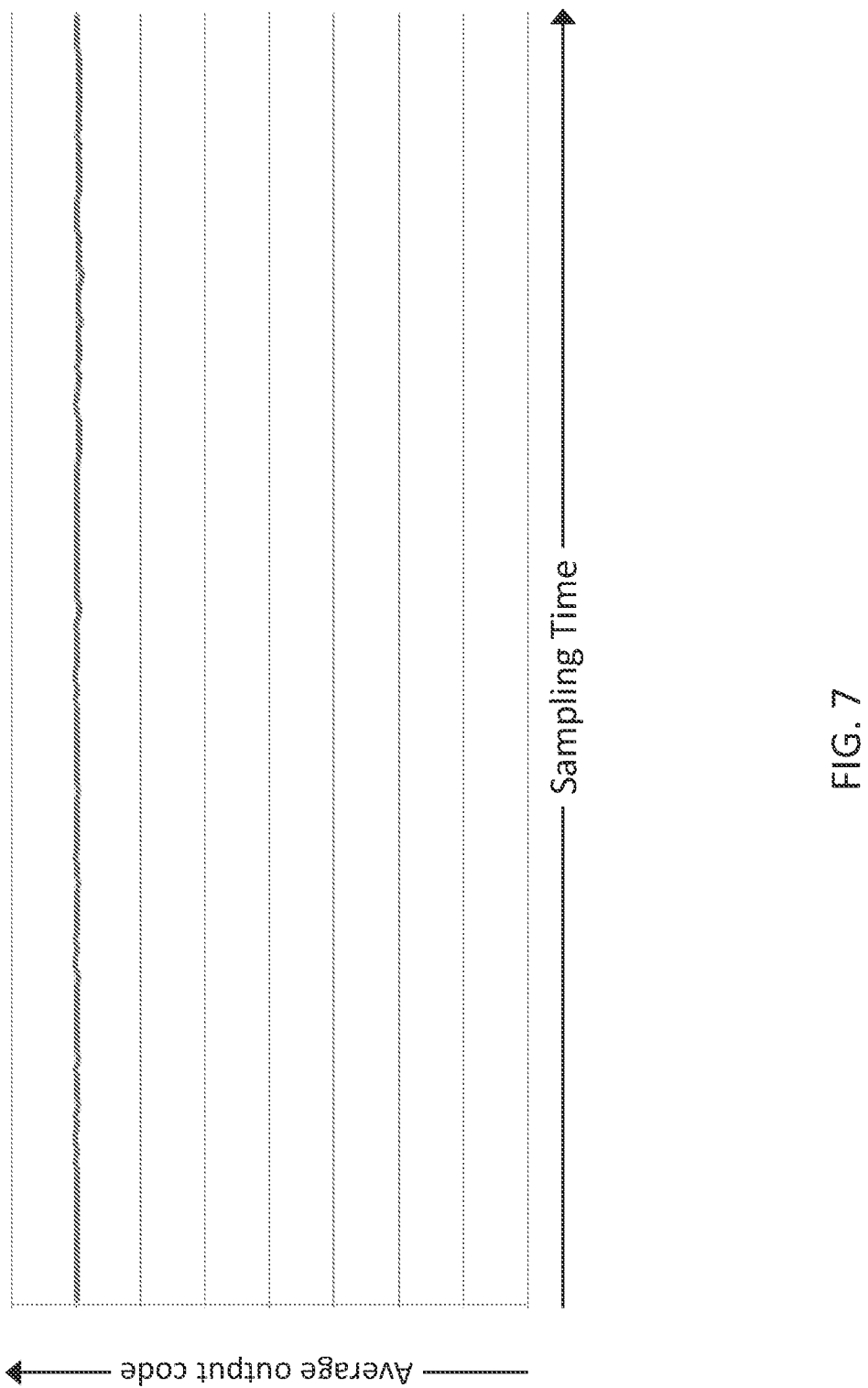
FIG. 7 shows the results of conversion of a constant input voltage over various combinations of sampling and hold time for the example sample and conversion process for the device of FIG. 5.

FIG. 7 shows results of conversion of constant input voltage over various combinations of sampling and hold time for a convention sample and conversion process for the device of FIG. 5. Again no values are provided for either axis as the graph is merely intended to convey the nature of the conversion output over a prolonged sampling and hold time using the a device such as the one or FIG. 5. As seen in comparison to the graph of FIG. 4, the average output code does not show a sample and hold time-dependent error attributable to dielectric absorption and instead stays closer to an ideal conversion value.

Figure 8:
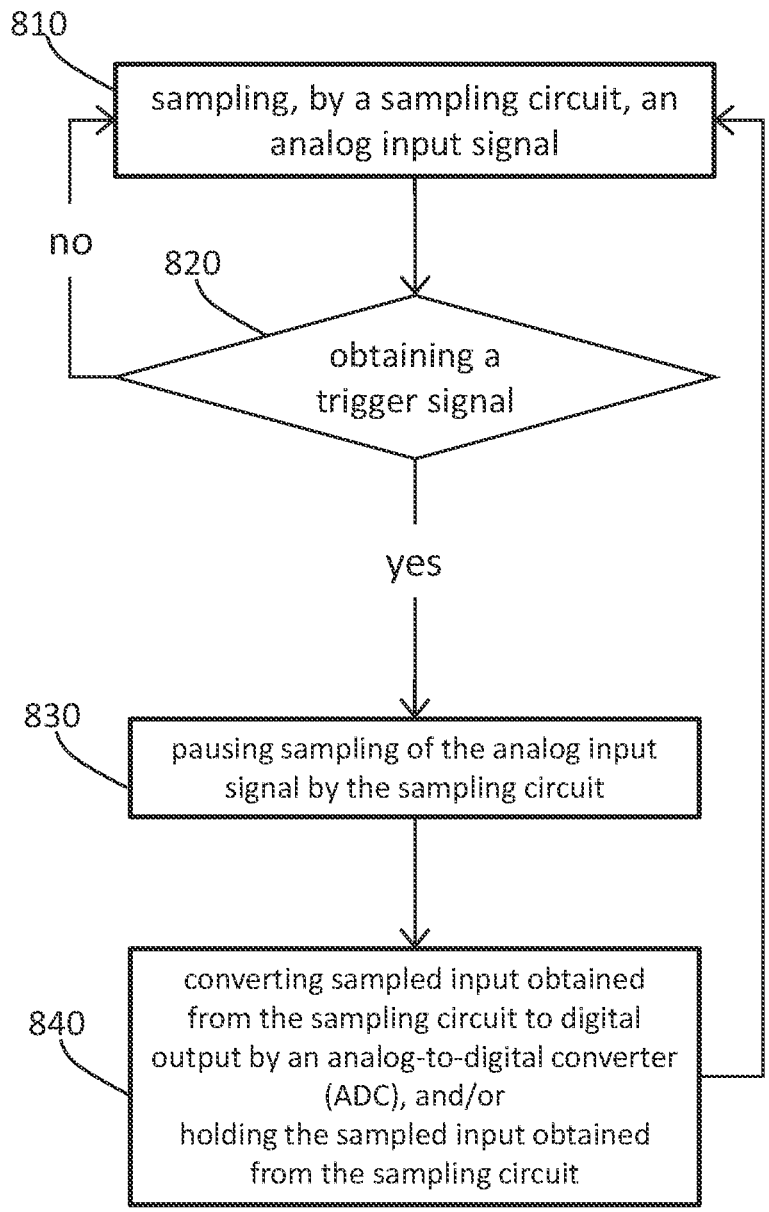
FIG. 8 is a flow diagram outlining an example method according to at least one embodiment of the present disclosure.

FIG. 8 shows a method according to at least one exemplary embodiment of the present disclosure. A device can implement the method or technique like the ADC device 500 illustrated in FIG. 5. The method can include at 810, sampling, by a sampling circuit of the device, an analog input signal. The method includes obtaining a trigger signal at 820. If a trigger signal is obtained, then at 830, the method includes pausing sampling of the analog input signal by the sampling circuit.

For example, if a trigger is signal is not obtained, then the method includes the sampling circuit to continue sampling. Otherwise, if a trigger signal is obtained, then the sampling circuit that was sampling, stops the sampling process, and holds the current sampled input or voltage.

After pausing sampling, the method includes at 840, converting the sampled input obtained from the sampling circuit to digital output by an analog-to-digital converter (ADC), and/or holding the sampled input obtained from the sampling circuit. That is, in at least one example, the ADC circuit may include an ADC and a holding circuit. After pausing of sampling by a trigger signal, the ADC circuit can be configured to obtain the sampled input and decide to hold the sampled input and later convert to digital. The ADC circuit may also be configured to, depending on the circumstances, to obtain the sampled input can be configured to immediately convert the sampled input to a digital output or digital signal. After the conversion process ends, e.g., after holding and/or converting has been completed or ended by an ADC circuit, the method can start at 810 to sampling again.

The method can be implemented by a device such as or similar in concept to the ADC device 500. The method can be implemented to reduce input current because high input can otherwise result in costlier sensor and costlier system design. Further, the devices and methods described herein do not require bigger blocking capacitor that also leads to gain errors and higher costs due to system design and PCB requirements. In addition, the performance, specifically the ADC performance improves due to reduction of dielectric absorption effects because of the continuous sampling.

The following examples pertain to further exemplary implementations.

Example 1 is a system including a sampling circuit configured to sample an input signal, wherein the sampling circuit is configured to stop sampling in response to obtaining a trigger signal; an analog-to-digital converter circuit comprising: an analog to digital converter (ADC) to convert sampled input provided from the sampling circuit to digital output; wherein ADC is configured to begin convert the sampled input from the sampling circuit when or after the sampling circuit has stopped sampling.

Example 2 is the subject matter of Example 1, wherein the analog-to-digital conversion circuit may further include a holding circuit configured to hold the sampled input from the sampling circuit when or after the sampling circuit has stopped sampling.

Example 3 is the subject matter of Example 1 or 2, wherein the sampling circuit may be configured to begin sampling upon a power-up of the system.

Example 4 is the subject matter of any one of Examples 1 to 3, wherein the sampling circuit may further include a sample switch coupled between an input of the sampling circuit and an input to the analog-to-digital converter circuit, and wherein sampling circuit is configured to stop sampling in response to obtaining the trigger signal comprises by opening the sample switch.

Example 5 is the subject matter of Example 4, wherein the sample switch may be configured as a normally closed switch, and wherein the sample switch may be configured to be closed during sampling.

Example 6 is the subject matter of Example of any one of Examples 1 to 5, wherein the sampling circuit may be configured to stop sampling for a period of time in response to obtaining the trigger signal.

Example 7 is the subject matter of Example 6, wherein the ADC may be configured to cease converting the sampled input after or at an expiration of the period of time.

Example 8 is the subject matter of Example 6 or 7, wherein the period of time may be a predefined period of time.

Example 9 is the subject matter of any one of Examples 1 to 8, wherein the sampling circuit may be configured to resume sampling after or at an expiration of the ADC ceases converting the sampled input.

Example 10 is the subject matter of any of Examples 4 to 9, wherein the sampling circuit may further include an input capacitor coupled between a reference potential and the input of the sampling circuit.

Example 11 is the subject matter of any one of Examples 1 to 10, wherein the ADC may be a successive-approximation-register (SAR) ADC.

Example 12 is the subject matter of any of Examples 1 to 11, wherein the ADC may be configured to begin converting the sampled input, in response to the ADC circuit obtaining a second trigger signal is different from the first trigger signal.

Example 13 is the subject matter of any of Examples 1 to 12, wherein the sampling circuit may be further configured to hold the sampled input captured at the obtaining of the trigger signal.

Example 14 is the subject matter of any of Examples 1 to 13, wherein the sampling circuit may be further configured to continuously sample the input signal prior and up to the obtaining of the trigger signal.

Example 15 is the subject matter of any of Examples 1 to 14, wherein the sampling circuit may be configured to stop sampling immediately after obtaining the trigger signal.

Example 16 is the subject matter of any of Examples 1 to 14, wherein the sampling circuit may be configured to stop sampling after a predefined period of time after obtaining the trigger signal.

Example 17 is a method including: sampling, by a sampling circuit, an analog input signal; obtaining a trigger signal; in response to obtaining the trigger signal, pausing sampling of the analog input signal by the sampling circuit; and during the pausing of the sampling, converting sampled input obtained from the sampling circuit to digital output by an analog-to-digital converter (ADC) and/or holding the sampled input obtained from the sampling circuit.

Example 18 is the subject matter of Example 17, wherein the pausing of the sampling of the analog input signal may include pausing the sampling for a period of time.

Example 19 is the subject matter of Example 17 or 18, which may further include resuming sampling of the analog input signal when or after converting by the ADC ceases.

Example 20 is the subject matter of Example 18 or 19, wherein the period of time may be predefined.

Example 21 is the subject matter of any of Examples 17 to 20, which may further include discontinuing converting or holding of the sampled input after or at the end of the period of time.

Example 22 is the subject matter of any of Examples 17 to 21, wherein pausing sampling of the analog input signal may include opening a sample switch of the sampling circuit, the sample switch coupled between an input of the sampling circuit and an input to the ADC.

Example 23 is the subject matter of any of Examples 17 to 22, wherein the ADC may be a successive-approximation-register (SAR) ADC.

Example 24 is the subject matter of any of Examples 17 to 23, wherein pausing sampling may include pausing sampling immediately after obtaining the trigger signal.

Example 25 is the subject matter of any of Examples 17 to 23, wherein pausing sampling may include pausing sampling after a predefined period of time after obtaining the trigger signal.

Example 26 is an analog-to-digital converter (ADC) system including: means for sampling an analog input signal, wherein the means for sampling comprises means for pausing sampling of the analog input signal in response to obtaining a trigger signal; means for holding sampled input obtained from the means for sampling, wherein the means for holding comprises means to initiate holding of the sampled input during pausing of the sampling; and means for converting sampled input to digital output, wherein the means for converting comprises means to initiate converting the sampled input during the pausing of the sampling.

Example 27 is the subject matter of Example 26, which may further include: means for producing a trigger signal.

Example 28 is the subject matter of Example 26 or 27, wherein the means for pausing sampling of the analog input signal may include means for pausing sampling for a period of time.

Example 29 is the subject matter of any of Examples 26 to 28, wherein the means for sampling may include means for resuming sampling after the period of time has expired.

Example 30 is the subject matter of Example 26, wherein the means for converting the sampled input may include means to stop converting the sampled before the means for sampling resumes sampling.

Example 31 is the subject matter of Example 29 or 30, wherein the period of time may be predefined.

It should be noted that one or more of the features of any of the examples above may be combined with any one of the other examples. It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include a one or more components configured to perform each aspect of the related method.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A system comprising:
a sampling circuit configured to perform sampling of an input signal and develop a sampled voltage on a sampling capacitor starting at a first time, wherein the sampling circuit is configured to stop the sampling at a second time to hold the sample voltage on the sampling capacitor in response to obtaining a trigger signal; and
an analog-to-digital converter circuit comprising:
an analog to digital converter (ADC) to convert a sampled input provided from the sampling circuit to a digital output,
wherein the ADC is configured to begin to convert the sampled input from the sampling circuit when or after the sampling circuit has stopped sampling, and completes conversion of the sampled input to the digital output at a third time; and
wherein the sampling circuit re-starts sampling the input signal at the third time.

2. The system of claim 1, wherein the sampling circuit re-starts the sampling of the input signal at the third time without a reset of the sampling capacitor such that a voltage over the sampling capacitor remains less than a reference potential between the first time and the second time.

3. The system of claim 1, wherein the sampling circuit is configured to begin sampling upon a power-up of the system.

4. The system of claim 1,
wherein the sampling circuit comprises a sample switch coupled between an input of the sampling circuit and the sampling capacitor, and wherein the sampling circuit is configured to stop sampling in response to obtaining the trigger signal by opening the sample switch.

5. The system of claim 4, wherein the sample switch is configured as a normally closed switch, and wherein the sample switch is configured to be closed during sampling.

6. The system of claim 1, wherein the sampling circuit is configured to stop sampling for a period of time in response to obtaining the trigger signal.

7. The system of claim 6, wherein the ADC is configured to cease converting the sampled input after or at an expiration of the period of time.

8. The system of claim 6, wherein the period of time is a predefined period of time.

9. The system of claim 1, wherein the sampling circuit is configured to resume sampling after or when the ADC ceases converting the sampled input.

10. The system of claim 1, wherein the sampling circuit further comprises an input capacitor coupled between a reference potential and an input of the sampling circuit.

11. The system of claim 1, wherein the ADC is a successive-approximation-register (SAR) ADC.

12. The system claim 1, wherein the ADC is configured to begin converting the sampled input, in response to the ADC obtaining a second trigger signal different from the trigger signal.

13. The system of claim 1, wherein the sampling circuit is further configured to continuously sample the input signal prior and up to the obtaining of the trigger signal.

14. The system of claim 1, wherein the sampling circuit is configured to stop sampling immediately after obtaining the trigger signal.

15. The system of claim 1, wherein the sampling circuit is configured to stop sampling after a predefined period of time after obtaining the trigger signal.

16. A method comprising:
performing sampling, by a sampling circuit including a sampling switch and a sampling capacitor, on an analog input signal, wherein the sampling develops a sampled voltage on the sampling capacitor starting at a first time when the sampling switch is closed;
obtaining a trigger signal;
in response to obtaining the trigger signal, opening the sampling switch at a second time to pause sampling of the analog input signal by the sampling circuit; and
during the pause of the sampling,
converting the sampled voltage obtained from the sampling circuit to a digital output by an analog-to-digital converter (ADC), wherein the conversion is completed at a third time, and
re-starting sampling of the analog input signal at the third time.

17. The method of claim 16,
wherein the pausing of the sampling of the analog input signal comprises pausing the sampling for a period of time.

18. The method of claim 16, wherein the sample switch is coupled between an input of the sampling circuit and an input to the ADC.

19. A system comprising:
a sampling circuit comprising a sampling switch coupled to a sampling capacitor, the sampling circuit configured to perform sampling of an input signal and develop a sampled voltage on the sampling capacitor starting at a first time when the sampling switch is closed, wherein the sampling circuit is configured to stop the sampling at a second time by opening the sampling switch in response to obtaining a trigger signal to hold the sampled voltage on the sampling capacitor; and
an analog to digital converter (ADC) to convert the sampled voltage provided from the sampling circuit to a digital output while the sampling switch is open, and completes conversion of the sampled input signal to the digital output at a third time; and
wherein the sampling circuit re-starts sampling the input signal at the third time without resetting the sampling capacitor to a fixed reference potential.

* * * * *